(12) United States Patent
Xu (10) Patent No.: US 9,947,754 B1
(45) Date of Patent: Apr. 17, 2018

(54) MANUFACTURING METHOD OF ARRAY SUBSTRATE AND LCD PANEL

(71) Applicant: Shenzhen China Star Optoelectronics Technology Co., Ltd., Shenzhen (CN)

(72) Inventor: Xiangyang Xu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 164 days.

(21) Appl. No.: 15/112,195

(22) PCT Filed: May 23, 2016

(86) PCT No.: PCT/CN2016/083058
§ 371 (c)(1),
(2) Date: Jul. 18, 2016

(87) PCT Pub. No.: WO2017/124673
PCT Pub. Date: Jul. 27, 2017

(30) Foreign Application Priority Data

Jan. 20, 2016 (CN) .......................... 2016 1 0041412

(51) Int. Cl.
*H01L 21/84* (2006.01)
*H01L 29/417* (2006.01)
(Continued)

(52) U.S. Cl.
CPC ...... *H01L 29/41733* (2013.01); *G02F 1/1335* (2013.01); *G02F 1/1368* (2013.01); *G02F 1/136286* (2013.01); *G09G 3/3225* (2013.01); *G09G 3/3648* (2013.01); *H01L 23/552* (2013.01); *H01L 27/12* (2013.01);
(Continued)

(58) Field of Classification Search
CPC ......... H01L 29/66765; H01L 29/78669; H01L 29/78678; H01L 29/78696; H01L 23/552; H01L 27/32; G02F 1/136286; G02F 1/1368; G02F 1/1335
See application file for complete search history.

(56) References Cited

U.S. PATENT DOCUMENTS

| | | | |
|---|---|---|---|
| 6,853,408 B2* | 2/2005 | Okamoto | G02F 1/136209 349/110 |
| 2002/0037600 A1* | 3/2002 | Hirabayashi | H01L 31/02164 438/30 |
| 2007/0247558 A1* | 10/2007 | Lin | G02F 1/136213 349/43 |

* cited by examiner

*Primary Examiner* — Richard Booth
(74) *Attorney, Agent, or Firm* — Leong C. Lei (57) ABSTRACT

The invention provides a manufacturing method of array substrate, wherein a light-shielding layer is disposed on the semiconductor layer, the light-shielding layer is a light-absorbing positive photo-resist, the light-shielding layer uses the same layer design as the photo-resist layer used for etching the semiconductor layer, after etching the semiconductor layer, the photo-resist layer is baked to obtain the light-shielding layer smaller than the semiconductor layer to shield the irradiation on the semiconductor layer to reduce the current leakage; then ohmic contact layer is formed at both ends of the semiconductor layer by phosphorus ion-implantation. In the LCD panel, the light-shielding layer is disposed on the semiconductor layer, the light-shielding layer serves both as an etching stopper and light-shielding, and can replace the BM of the conventional CF substrate to block light irradiation on the semiconductor layer, reduce leakage current, simplify panel structure, and improve aperture ratio.

13 Claims, 8 Drawing Sheets (51) Int. Cl.
  *H01L 29/66* (2006.01)
  *H01L 29/786* (2006.01)
  *H01L 23/552* (2006.01)
  *G02F 1/1362* (2006.01)
  *G02F 1/1368* (2006.01)
  *G02F 1/1335* (2006.01)
  *H01L 27/32* (2006.01)
  *G09G 3/3225* (2016.01)
  *G09G 3/36* (2006.01)
  *H01L 27/12* (2006.01)
  *H01L 21/77* (2017.01)

(52) U.S. Cl.
  CPC ........ *H01L 27/32* (2013.01); *H01L 29/66765* (2013.01); *H01L 29/78669* (2013.01); *H01L 29/78678* (2013.01); *H01L 29/78696* (2013.01); *H01L 21/77* (2013.01)

MANUFACTURING METHOD OF ARRAY SUBSTRATE AND LCD PANEL

BACKGROUND OF THE INVENTION

1. Field of the Invention

The present invention relates to the field of display, and in particular to a manufacturing method of array substrate and a liquid crystal display (LCD) panel.

2. The Related Arts

In the rapid development of display technology, the liquid crystal display (LCD) and organic light-emitting diode (OLED) display have the advantages of high display quality, low power-consumption, and thin, and are widely used in applications, such as, mobile phone, TV, personal digital assistant (PDA), digital camera, notebook PC, desktop PC, and so on, and become the mainstream display technology.

The majority of the current LCD devices are backlight LCD devices, which comprise an LCD panel and a backlight module. The operation principle of the LCD panel is to place liquid crystal (LC) molecules between two parallel glass substrates, and the two glass substrates have many vertical and horizontal fine wires in-between. By applying electricity to control the LC molecules to change direction to refract the light from the backlight module to generate images.

Figure 1:
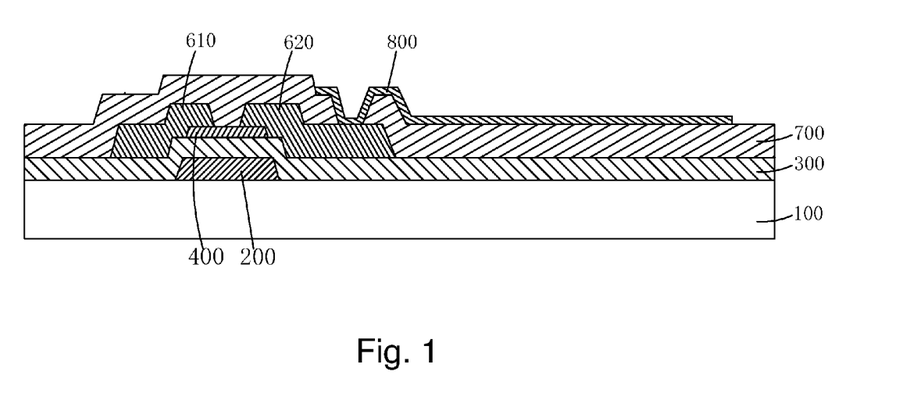
FIG. 1 is a schematic view showing the structure of a known TFT array substrate.
Figure 2:
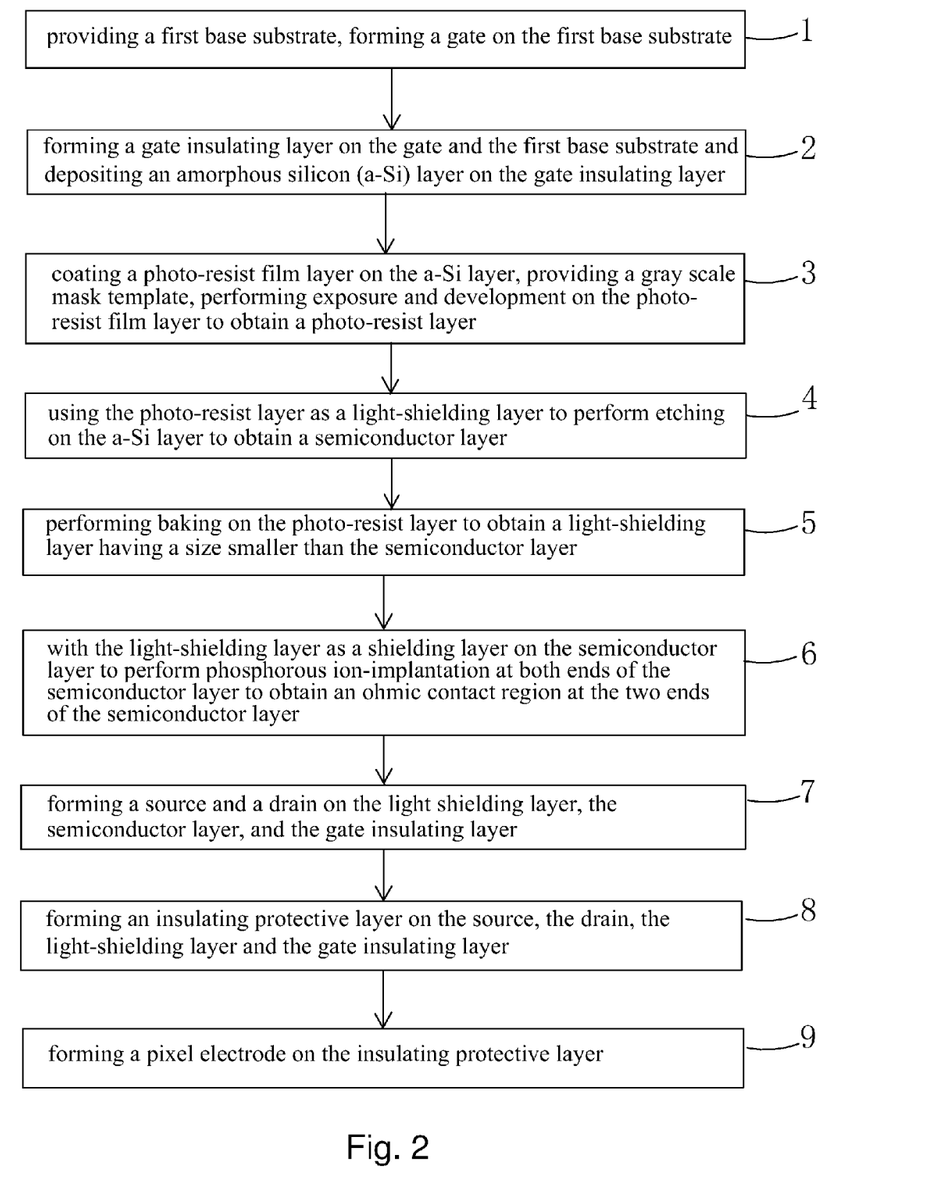
FIG. 2 is a schematic view showing the flowchart of the manufacturing method of array substrate provided by an embodiment of the present invention.

In general, the LCD panel comprises a color filter (CF) substrate, a thin film transistor (TFT) array substrate, a LC sandwiched between the CF substrate and the TFT substrate, and a sealant. The manufacturing process comprises: the array process (thin film, lithography, etching and stripping), the cell process (TFT substrate and CF substrate attachment), and the module assembly process (driver IC and PCB press attachment). The array process is to form TFT array substrate to control the LC molecules motion. The cell process is to add the LC between the TFT array substrate and the CF substrate. The module assembly process is to integrate the driver IC and the PCB to drive the rotation of LC molecules and display the images. The TFT substrate is disposed with a plurality of scan lines and a plurality of data lines. The plurality of scan lines and the plurality of data lines define a plurality of pixel units, with each pixel unit disposed with TFT and pixel electrode. The gate of the TFT is connected to corresponding gate line. When the voltage of the gate line reaches a turn-on voltage, the source and the drain of the TFT are conductive so as to input the data voltage of the data line to the pixel electrode. The pixel units of the conventional TFT array substrate is structured as shown in FIG. 1, comprising: a substrate 100, a gate 200, a gate insulating layer 300, an active layer 400, a source 610, a drain 620, an insulating protective layer 700, and a pixel electrode 800, all stacked from the bottom up. Because the active layer 400 of the TFT is sensitive to the light irradiation, in particular, a-Si semiconductor material, the ambient light irradiation will cause a great increase in the drain current of TFT, leading to cross-talk and voltage flicker, thereby resulting in affecting the quality of the display screen. To avoid irradiation on the semiconductor layer by the ambient light, a black matrix (BM) light-shielding layer is usually disposed at the CF substrate side of the LCD panel. Although this method can effectively prevent the active layer 400 from light transmittance, but the presence of light-shielding layer will reduce the aperture ratio of the LCD panel.

SUMMARY OF THE INVENTION

The object of the present invention is to provide a manufacturing method of array substrate, by baking the photo-resist on the photo-resist layer formed by etching to obtain a light-shielding layer on the semiconductor layer. The process is simple.

Another object of the present invention is to provide an LCD panel, with the semiconductor layer of the array substrate disposed with a light-shielding layer to save the BM of the CF substrate. The panel has a simple structure and provides high aperture ratio.

To achieve the above object, the present invention provides a manufacturing method of array substrate, which comprises the steps of:

Step 1: providing a first base substrate, depositing a gate metal layer on the first base substrate, and patternizing the gate metal layer to obtain a gate;

Step 2: depositing a gate insulating layer on the gate, the first base substrate and depositing an amorphous silicon (a-Si) layer on the gate insulating layer;

Step 3: coating a photo-resist film layer on the a-Si layer, providing a gray scale mask template, performing exposure and development on the photo-resist film layer to obtain a photo-resist layer, the photo-resist layer comprising a centrally located first photo-resist layer, and a second photo-resist layer, with thickness less than the first photo-resist layer and located on both sides of the first photo-resist layer; the material of the photo-resist film material being a positive photo-resist having light absorption characteristics;

Step 4: using the photo-resist layer as a light-shielding layer to perform etching on the a-Si layer to obtain a semiconductor layer;

Step 5: performing baking on the photo-resist layer to remove the second photo-resist layer and reduce the thickness of the first photo-resist layer to obtain a light-shielding layer, the light-shielding layer having a size smaller than the size of the semiconductor layer;

Step 6: with the light-shielding layer as a shielding layer on the semiconductor layer to perform phosphorous ion-implantation at both ends of the semiconductor layer to obtain an ohmic contact region at the two ends of the semiconductor layer, and a channel region in the middle without ion-implantation;

Step 7: depositing a source and drain metal layer on the light shielding layer, the semiconductor layer, and the gate insulating layer, and patternizing the source and drain metal layer to obtain a source and a drain, with the source and the drain contacting respectively with the ohmic contact regions, at both ends of the semiconductor layer;

Step 8: depositing an insulating protective layer on the source, the drain, the light-shielding layer and the gate insulating layer, patternizing the insulating protective layer to obtain a via hole through the insulating protective layer located above the drain; and Step 9: depositing a transparent conductive layer on the insulating protective layer and patternizing the transparent conductive layer to obtain a pixel electrode, the pixel electrode connecting to the drain through the via hole.

In Step 3, the thickness of the photo-resist film is 1.8-3.0 µm; in the Step 4, after baking the photo-resist layer, the thickness of the light-shielding layer is 0.7-1.7 µm.

In Step 1, the gate metal layer deposited by physical vapor deposition has a thickness of is 3000-6000 Å, the material for the gate metal layer is one or more of the stacked combination of molybdenum, titanium, aluminum, and copper; in Step 7 the source and drain metal layer deposited by physical vapor deposition has a thickness of 3000-6000 Å, the material for the source and drain metal layer is one or more stacked combination of molybdenum, titanium, aluminum, and copper.

In Step 2, the gate insulating layer and the a-Si layer deposited by chemical vapor deposition have a thickness of 2000-5000 Å, and 500-1000 Å, respectively; in Step 8, the insulating protective layer deposited by chemical vapor deposition has a thickness of 2000-5000 Å, and the insulating protective layer is a silicon nitride layer.

In Step 9, the transparent conductive layer deposited by physical vapor deposition has a thickness of 400-1000 Å, the material for the transparent conductive layer is one or more of indium tin oxide, indium zinc oxide, aluminum tin oxide, zinc aluminum oxide, zinc oxide, and indium germanium.

The present invention also provides a liquid crystal display (LCD) panel, which comprises: an array substrate, a color filer (CF) substrate disposed opposite to the array substrate, and a liquid crystal (LC) layer sandwiched between the array substrate and the CF substrate; the array substrate comprising: a first base substrate, a plurality of gate scan lines and a plurality of data lines disposed on the first base substrate, and a plurality of pixel units defined by the mutually insulated plurality of gate scan lines and data lines, and arranged in an array; the CF substrate comprising: a second base substrate, a CF layer disposed on a surface of the CF substrate near the array substrate, a common electrode layer disposed on the CF layer, and a spacer layer disposed on the common electrode layer; each pixel unit of the array substrate comprising: a gate formed on the first base substrate, a gate insulating layer formed on the gate and the first base substrate, a semiconductor layer formed on the gate insulating layer, a light-shielding layer located on the semiconductor layer, a source and a drain formed on the light-shielding layer, the semiconductor layer and the gate insulating layer, an insulating protective layer formed on the source, the drain, the light-shielding later and the gate insulating layer, and a pixel electrode formed on the insulating protective layer; and the light-shielding layer serving as an etching stopper and shielding light, having a size smaller than the semiconductor layer and made of a light-absorbing positive photo-resist.

The thickness of the light-shielding layer is 0.7-1.7 µm.

The semiconductor layer comprises a channel region located in the middle and an ohmic contact region located at both ends, the light-shielding layer completely covers the channel region, the ohmic contact regions are obtained by performing phosphorus ion-implanted with the light-shielding layer as a shielding layer on both ends of the semiconductor layer, the source and the drain contact respectively with the ohmic contact region at the two ends of the semiconductor layer.

The insulating protective layer is disposed with a via hole penetrating the insulating protective layer above the drain, and the pixel electrode contacts the drain through the via hole.

The semiconductor layer is obtained by using the photo-resist layer disposed on the amorphous silicon (a-Si) layer as a shielding layer to perform etching on the a-Si layer, the light-shielding layer is obtained by baking the photo-resist layer.

The present invention also provides a liquid crystal display (LCD) panel, which comprises: an array substrate, a color filer (CF) substrate disposed opposite to the array substrate, and a liquid crystal (LC) layer sandwiched between the array substrate and the CF substrate; the array substrate comprising: a first base substrate, a plurality of gate scan lines and a plurality of data lines disposed on the first base substrate, and a plurality of pixel units defined by the mutually insulated plurality of gate scan lines and data lines, and arranged in an array; the CF substrate comprising: a second base substrate, a CF layer disposed on a surface of the CF substrate near the array substrate, a common electrode layer disposed on the CF layer, and a spacer layer disposed on the common electrode layer; each pixel unit of the array substrate comprising: a gate formed on the first base substrate, a gate insulating layer formed on the gate and the first base substrate, a semiconductor layer formed on the gate insulating layer, a light-shielding layer located on the semiconductor layer, a source and a drain formed on the light-shielding layer, the semiconductor layer and the gate insulating layer, an insulating protective layer formed on the source, the drain, the light-shielding later and the gate insulating layer, and a pixel electrode formed on the insulating protective layer; and the light-shielding layer serving as an etching stopper and shielding light, having a size smaller than the semiconductor layer and made of a light-absorbing positive photo-resist; wherein the thickness of the light-shielding layer is 0.7-1.7 µm; and wherein the semiconductor layer comprises a channel region located in the middle and an ohmic contact region located at both ends, the light-shielding layer completely covers the channel region, the ohmic contact regions are obtained by performing phosphorus ion-implanted with the light-shielding layer as a shielding layer on both ends of the semiconductor layer, the source and the drain contact respectively with the ohmic contact region at the two ends of the semiconductor layer.

Compared to the known techniques, the present invention provides the following advantages: the present invention provides a manufacturing method of array substrate and an LCD panel. In the manufacturing method of array substrate of the present invention, a light-shielding layer is disposed on the semiconductor layer, the light-shielding layer is a light-absorbing positive photo-resist, the light-shielding layer uses the same layer design as the photo-resist layer used for etching the semiconductor layer, after etching the semiconductor layer, the photo-resist layer is baked to obtain the light-shielding layer smaller than the semiconductor layer to shield the irradiation on the semiconductor layer to reduce the current leakage; then ohmic contact layer is formed at both ends of the semiconductor layer by phosphorus ion-implantation. The manufacturing method is simple and effective. In the LCD panel of the present invention, the light-shielding layer is disposed on the semiconductor layer, the light-shielding layer serves both as an etching stopper and light-shielding, and is able to replace the BM of the conventional CF substrate to block the light irradiation on the semiconductor layer, reduce the leakage current, simplify the panel structure, and improve the aperture ratio.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 3:
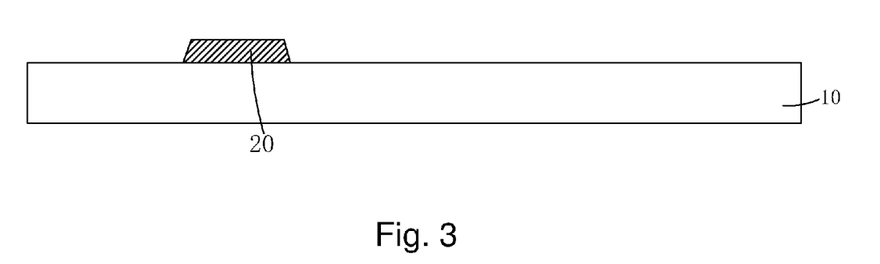
FIG. 3 is a schematic view showing Step 1 of the manufacturing method of array substrate provided by an embodiment of the present invention.

Refer to FIG. 1. The present invention provides a manufacturing method of array substrate, which comprises the following steps:

Step 1: as shown in FIG. 3, providing a first base substrate 10, depositing a gate metal layer on the first base substrate 10, and patternizing the gate metal layer to obtain a gate 20.

Specifically, in Step 1, the gate metal layer deposited by physical vapor deposition has a thickness of is 3000-6000 Å, the material for the gate metal layer is one or more of the stacked combination of molybdenum, titanium, aluminum, and copper; specifically, by using mask to perform exposure, development, wet etching and stripping to accomplish patternizing the gate metal layer.

Figure 4:
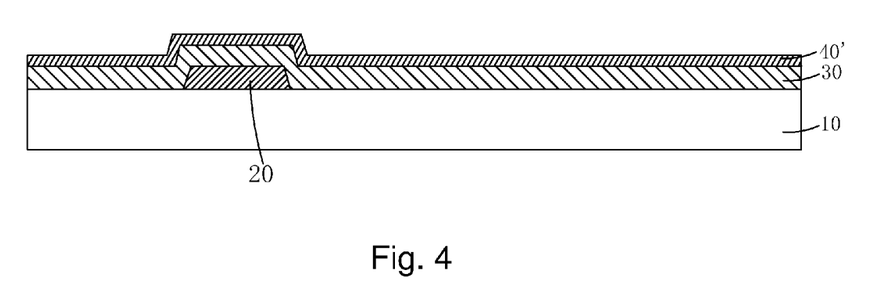
FIG. 4 is a schematic view showing Step 2 of the manufacturing method of array substrate provided by an embodiment of the present invention.

Step 2: as shown in FIG. 4, depositing a gate insulating layer 30 on the gate 20, the first base substrate 10 and depositing an amorphous silicon (a-Si) layer 40' on the gate insulating layer 30.

Specifically, in Step 2, the gate insulating layer 30 and the a-Si layer 40' deposited by chemical vapor deposition have a thickness of 2000-5000 Å, and 500-1000 Å, respectively; preferably, the gate insulating layer 30 is a silicon nitride layer.

Figure 5:
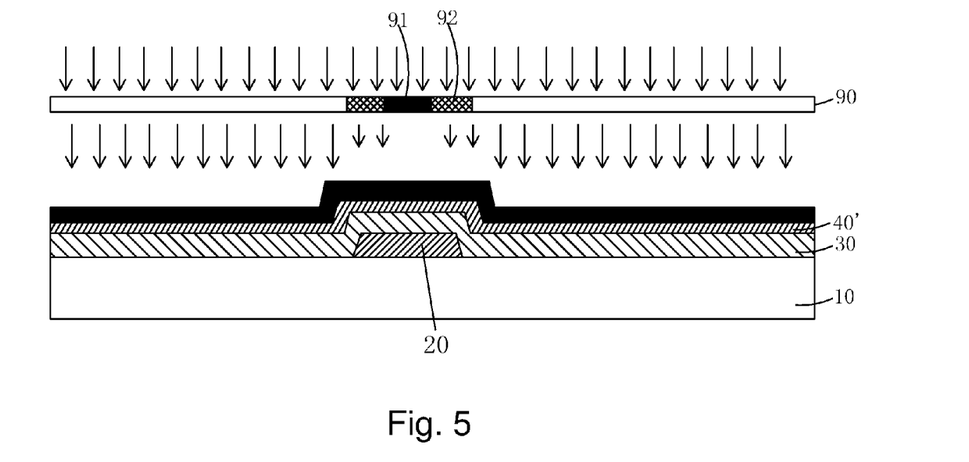
FIG. 5 is a schematic view showing performing exposure on the photo-resist film in Step 3 of the manufacturing method of array substrate provided by an embodiment of the present invention.
Figure 6:
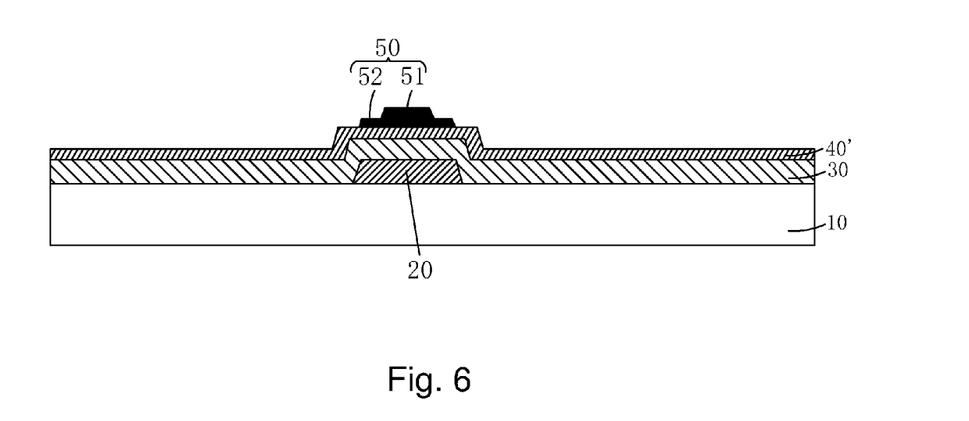
FIG. 6 is a schematic view showing performing development after performing exposure on the photo-resist film in Step 3 of the manufacturing method of array substrate provided by an embodiment of the present invention.

Step 3: as shown in FIGS. 5-6, coating a photo-resist film layer on the a-Si layer 40', providing a gray scale mask template 90, performing exposure and development on the photo-resist film layer to obtain a photo-resist layer 50 located on the a-Si layer 40' above the corresponding gate 20, the photo-resist layer 50 comprising a centrally located first photo-resist layer 51, and a second photo-resist layer 52, with thickness less than the first photo-resist layer 51 and located on both sides of the first photo-resist layer 51.

Specifically, the material of the photo-resist film material is a positive photo-resist having light absorption characteristics.

Specifically, in Step 3, the thickness of the photo-resist film is 1.8-3.0 μm; a first portion 91 of the gray scale mask template 90 corresponding to the first photo-resist layer 51 is opaque, and a second portion 92 corresponding to the second photo-resist layer 52 is translucent, and the remaining is completely transparent.

Figure 7:
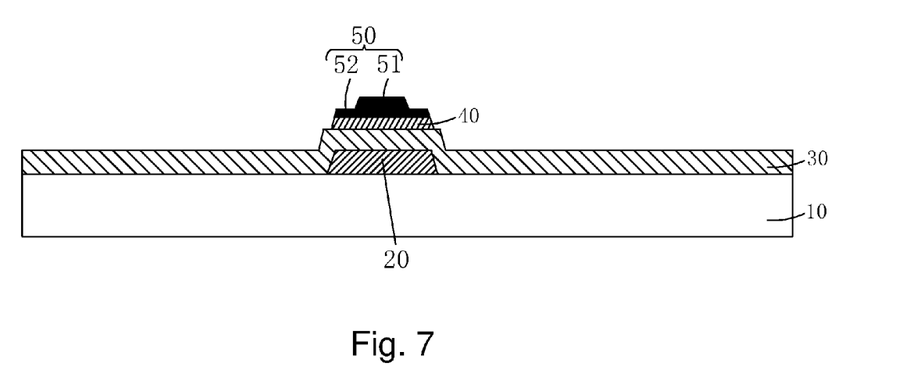
FIG. 7 is a schematic view showing Step 4 of the manufacturing method of array substrate provided by an embodiment of the present invention.

Step 4: as shown in FIG. 7, using the photo-resist layer 50 as a light-shielding layer to perform etching on the a-Si layer 40' to obtain a semiconductor layer 40.

Specifically, in the Step 4, after baking the photo-resist layer 50, the thickness of the light-shielding layer 501 is 0.7-1.7 μm.

Figure 8:
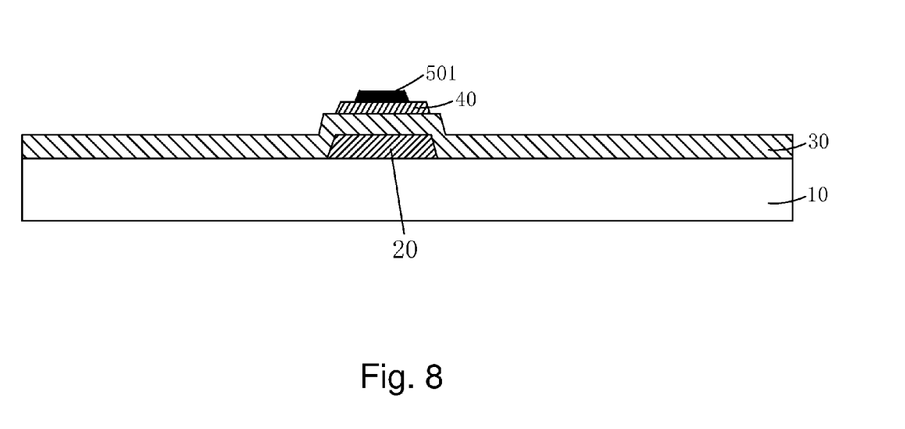
FIG. 8 is a schematic view showing Step 5 of the manufacturing method of array substrate provided by an embodiment of the present invention.

Step 5: as shown in FIG. 8, performing baking on the photo-resist layer 50 to remove the second photo-resist layer 52 and reduce the thickness of the first photo-resist layer 51 to obtain a light-shielding layer 501, the light-shielding layer 501 having a size smaller than the size of the semiconductor layer 40.

Figure 9:
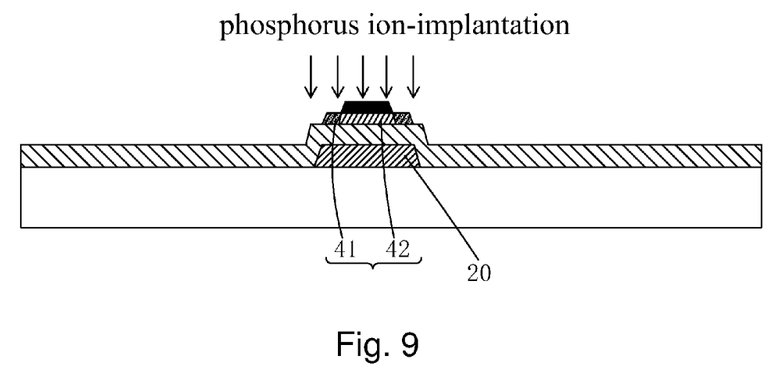
FIG. 9 is a schematic view showing Step 6 of the manufacturing method of array substrate provided by an embodiment of the present invention.

Step 6: as shown in FIG. 9, with the light-shielding layer 501 as a shielding layer on the semiconductor layer 40 to perform phosphorous ion-implantation at both ends of the semiconductor layer 40 to obtain an ohmic contact region 41 at the two ends of the semiconductor layer 40, and a channel region in the middle without ion-implantation 42.

Figure 10:
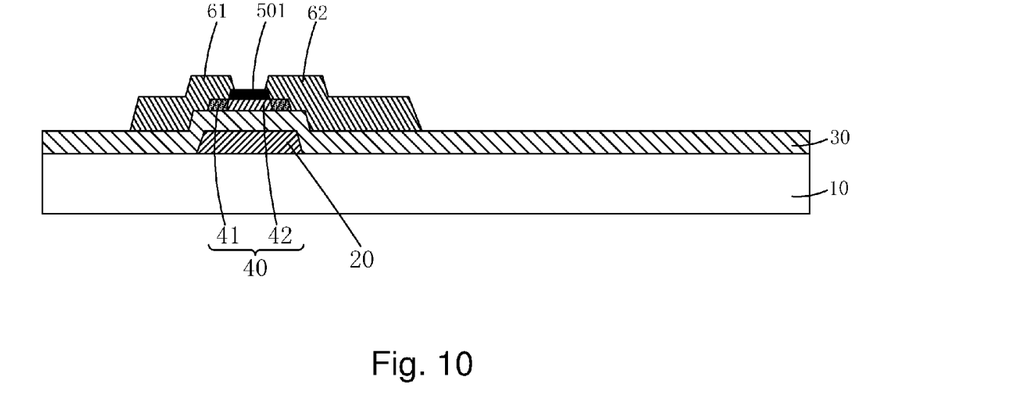
FIG. 10 is a schematic view showing Step 7 of the manufacturing method of array substrate provided by an embodiment of the present invention.

Step 7: as shown in FIG. 10, depositing a source and drain metal layer on the light shielding layer 501, the semiconductor layer 40, and the gate insulating layer 30, and patternizing the source and drain metal layer to obtain a source 61 and a drain 62, with the source 61 and the drain 62 contacting respectively with the ohmic contact regions 41, at both ends of the semiconductor layer 40.

Specifically, in Step 7, the source and drain metal layer deposited by physical vapor deposition has a thickness of 3000-6000 Å, the material for the source and drain metal layer is one or more stacked combination of molybdenum, titanium, aluminum, and copper; specifically, by using mask to perform exposure, development, wet etching and stripping to accomplish patternizing the source and drain metal layer.

Figure 11:
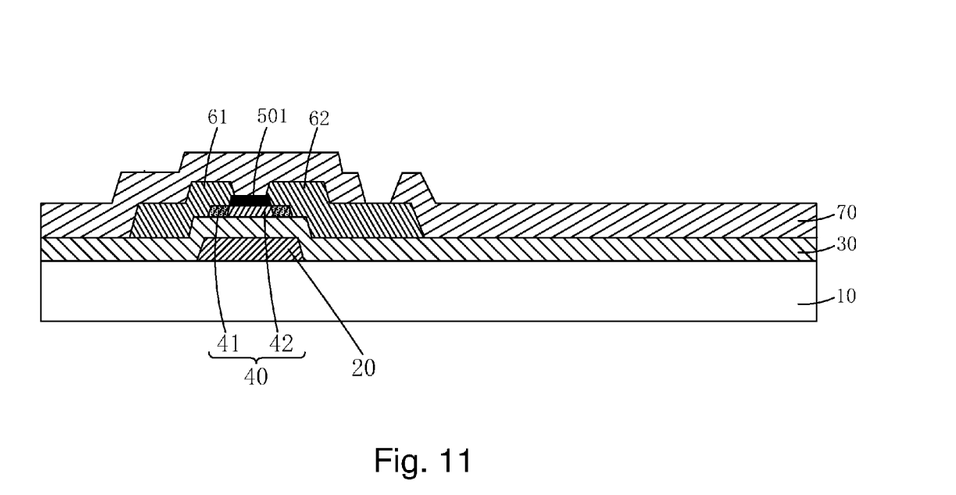
FIG. 11 is a schematic view showing Step 8 of the manufacturing method of array substrate provided by an embodiment of the present invention.

Step 8: as shown in FIG. 11, depositing an insulating protective layer 70 on the source 61, the drain 62, the light-shielding layer 501 and the gate insulating layer 40, patternizing the insulating protective layer 70 to obtain a via hole 71 through the insulating protective layer 70 located above the drain 62.

Specifically, in Step 8, the insulating protective layer 70 deposited by chemical vapor deposition has a thickness of 2000-5000 Å, and preferably the insulating protective layer is a silicon nitride layer. Specifically, patternizing the insulating protective layer 70 is accomplished by using mask to perform exposure, development, wet etching and stripping.

Figure 12:
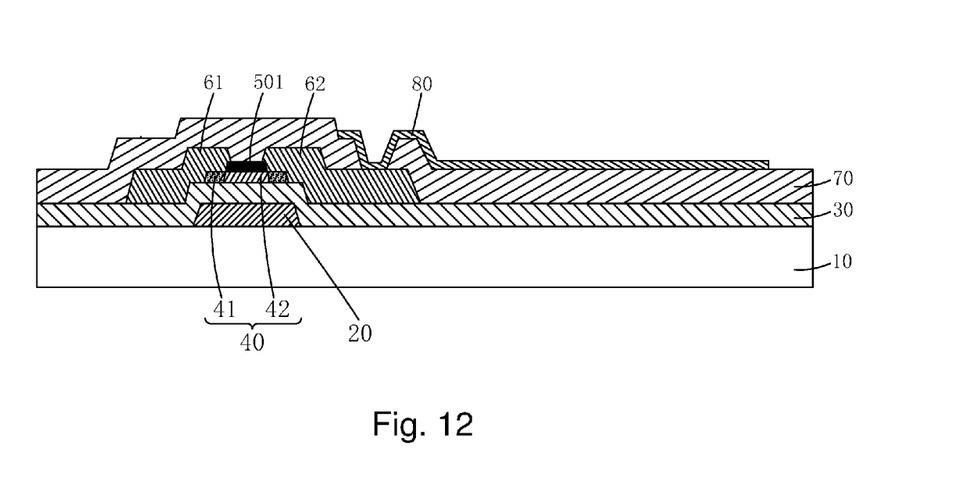
FIG. 12 is a schematic view showing Step 9 of the manufacturing method of array substrate provided by an embodiment of the present invention.

Step 9: as shown in FIG. 12, depositing a transparent conductive layer on the insulating protective layer 70 and patternizing the transparent conductive layer to obtain a pixel electrode 80, the pixel electrode 80 connecting to the drain 62 through the via hole 71.

Specifically, in Step 9, the transparent conductive layer deposited by physical vapor deposition has a thickness of 400-1000 Å, the material for the transparent conductive layer is one or more of indium tin oxide, indium zinc oxide, aluminum tin oxide, zinc aluminum oxide, zinc oxide, and indium germanium. Specifically, patternizing the transparent conductive layer is accomplished by using mask to perform exposure, development, wet etching and stripping.

Figure 13:
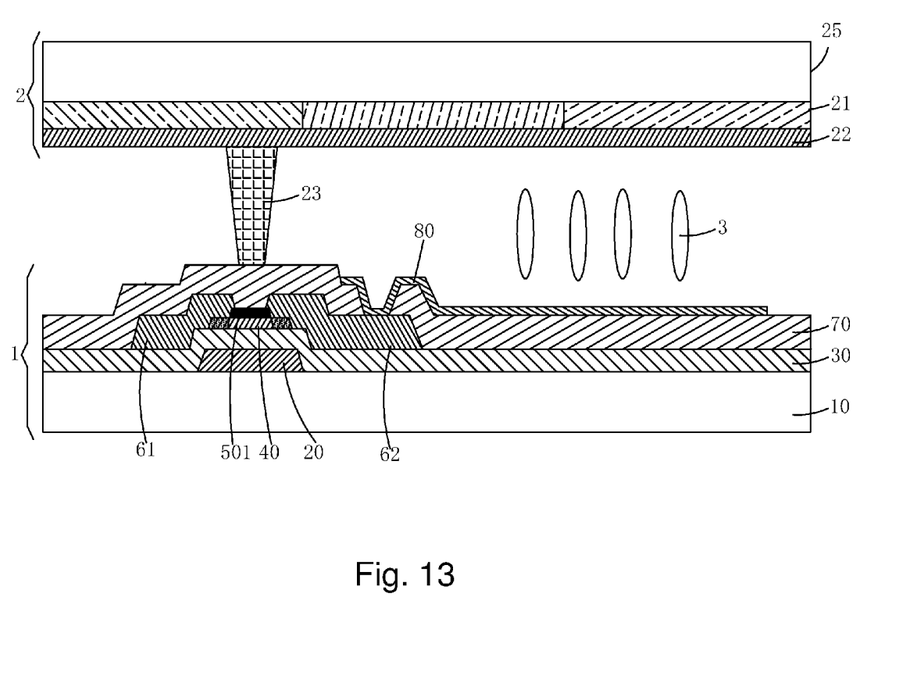
FIG. 13 is a schematic view showing the structure of an LCD panel provided by an embodiment of the present invention.

Refer to FIG. 13, based on the above manufacturing method of array substrate, present invention also provides an LCD panel, which comprises: an array substrate 1, a CF substrate 2 disposed opposite to the array substrate 1, and an LC layer 3 sandwiched between the array substrate 1 and the CF substrate 2.

The array substrate 1 comprises: a first base substrate 10, a plurality of gate scan lines and a plurality of data lines disposed on the first base substrate 10, and a plurality of pixel units defined by the mutually insulated plurality of gate scan lines and data lines, and arranged in an array.

The CF substrate 2 comprises: a second base substrate 25, a CF layer 21 disposed on a surface of the CF substrate 2 near the array substrate 1, a common electrode layer 22 disposed on the CF layer 21, and a spacer layer 23 disposed on the common electrode layer 22.

Each pixel unit of the array substrate 1 comprises: a gate 20 formed on the first base substrate 10, a gate insulating layer 30 formed on the gate 20 and the first base substrate 10, a semiconductor layer 40 formed on the gate insulating layer 30 above the corresponding gate 20, a light-shielding layer 501 located on the semiconductor layer 40, a source 61 and a drain 62 formed on the light-shielding layer 501, the semiconductor layer 40 and the gate insulating layer 30, an insulating protective layer 70 formed on the source 61, the drain 62, the light-shielding later 501 and the gate insulating layer 30, and a pixel electrode 80 formed on the insulating protective layer 70.

The light-shielding layer 501 serves as an etching stopper and shielding light, having a size smaller than the semiconductor layer 40 and made of a light-absorbing positive photo-resist.

Specifically, the semiconductor layer 40 is obtained by using the photo-resist layer disposed on the amorphous silicon (a-Si) layer as a shielding layer to perform etching on the a-Si layer, the light-shielding layer 501 is obtained by baking the photo-resist layer.

Specifically, the thickness of the light-shielding layer 501 is 0.7-1.7 μm.

Specifically, the semiconductor layer 40 comprises a channel region 42 located in the middle and an ohmic contact region 41 located at both ends, the light-shielding layer 501 completely covers the channel region 42, the ohmic contact regions 41 are obtained by performing phosphorus ion-implanted with the light-shielding layer 501 as a shielding layer on both ends of the semiconductor layer 40, the source 61 and the drain 62 contact respectively with the ohmic contact region 41 at the two ends of the semiconductor layer 40.

Specifically, the insulating protective layer 70 is disposed with a via hole 71 penetrating the insulating protective layer 70 above the drain 62, and the pixel electrode 80 contacts the drain 62 through the via hole 71.

In summary, the present invention provides a manufacturing method of array substrate and an LCD panel. In the manufacturing method of array substrate of the present invention, a light-shielding layer is disposed on the semiconductor layer, the light-shielding layer is a light-absorbing positive photo-resist, the light-shielding layer uses the same layer design as the photo-resist layer used for etching the semiconductor layer, after etching the semiconductor layer, the photo-resist layer is baked to obtain the light-shielding layer smaller than the semiconductor layer to shield the irradiation on the semiconductor layer to reduce the current leakage; then ohmic contact layer is formed at both ends of the semiconductor layer by phosphorus ion-implantation. The manufacturing method is simple and effective. In the LCD panel of the present invention, the light-shielding layer is disposed on the semiconductor layer, the light-shielding layer serves both as an etching stopper and light-shielding, and is able to replace the BM of the conventional CF substrate to block the light irradiation on the semiconductor layer, reduce the leakage current, simplify the panel structure, and improve the aperture ratio.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of array substrate, which comprises the steps of:

Step 1: providing a first base substrate, depositing a gate metal layer on the first base substrate, and patternizing the gate metal layer to obtain a gate;

Step 2: depositing a gate insulating layer on the gate, the first base substrate and depositing an amorphous silicon (a-Si) layer on the gate insulating layer;

Step 3: coating a photo-resist film layer on the a-Si layer, providing a gray scale mask template, performing exposure and development on the photo-resist film layer to obtain a photo-resist layer, the photo-resist layer comprising a centrally located first photo-resist layer, and a second photo-resist layer, with thickness less than the first photo-resist layer and located on both sides of the first photo-resist layer;

the material of the photo-resist film material being a positive photo-resist having light absorption characteristics;

Step 4: using the photo-resist layer as a light-shielding layer to perform etching on the a-Si layer to obtain a semiconductor layer;

Step 5: performing baking on the photo-resist layer to remove the second photo-resist layer and reduce the thickness of the first photo-resist layer to obtain a light-shielding layer, the light-shielding layer having a size smaller than the size of the semiconductor layer;

Step 6: with the light-shielding layer as a shielding layer on the semiconductor layer to perform phosphorous ion-implantation at both ends of the semiconductor layer to obtain an ohmic contact region at the two ends of the semiconductor layer, and a channel region in the middle without ion-implantation;

Step 7: depositing a source and drain metal layer on the light shielding layer, the semiconductor layer, and the gate insulating layer, and patternizing the source and drain metal layer to obtain a source and a drain, with the source and the drain contacting respectively with the ohmic contact regions, at both ends of the semiconductor layer;

Step 8: depositing an insulating protective layer on the source, the drain, the light-shielding layer and the gate insulating layer, patternizing the insulating protective layer to obtain a via hole through the insulating protective layer located above the drain; and Step 9: depositing a transparent conductive layer on the insulating protective layer and patternizing the transparent conductive layer to obtain a pixel electrode, the pixel electrode connecting to the drain through the via hole.

2. The manufacturing method of array substrate as claimed in claim 1, wherein in Step 3, the thickness of the photo-resist film is 1.8-3.0 μm; in the Step 4, after baking the photo-resist layer, the thickness of the light-shielding layer is 0.7-1.7 μm.

3. The manufacturing method of array substrate as claimed in claim 1, wherein in Step 1, the gate metal layer deposited by physical vapor deposition has a thickness of is 3000-6000 Å, the material for the gate metal layer is one or more of the stacked combination of molybdenum, titanium, aluminum, and copper; in Step 7 the source and drain metal layer deposited by physical vapor deposition has a thickness of 3000-6000 Å, the material for the source and drain metal layer is one or more stacked combination of molybdenum, titanium, aluminum, and copper.

4. The manufacturing method of array substrate as claimed in claim 1, wherein in Step 2, the gate insulating layer and the a-Si layer deposited by chemical vapor deposition have a thickness of 2000-5000 Å, and 500-1000 Å, respectively; in Step 8, the insulating protective layer deposited by chemical vapor deposition has a thickness of 2000-5000 Å, and the insulating protective layer is a silicon nitride layer.

5. The manufacturing method of array substrate as claimed in claim 1, wherein in Step 9, the transparent conductive layer deposited by physical vapor deposition has a thickness of 400-1000 Å, the material for the transparent conductive layer is one or more of indium tin oxide, indium zinc oxide, aluminum tin oxide, zinc aluminum oxide, zinc oxide, and indium germanium.

6. A liquid crystal display (LCD) panel, which comprises: an array substrate, a color filer (CF) substrate disposed opposite to the array substrate, and a liquid crystal (LC) layer sandwiched between the array substrate and the CF substrate;

the array substrate comprising: a first base substrate, a plurality of gate scan lines and a plurality of data lines disposed on the first base substrate, and a plurality of pixel units defined by the mutually insulated plurality of gate scan lines and data lines, and arranged in an array;

the CF substrate comprising: a second base substrate, a CF layer disposed on a surface of the CF substrate near the array substrate, a common electrode layer disposed on the CF layer, and a spacer layer disposed on the common electrode layer;

each pixel unit of the array substrate comprising: a gate formed on the first base substrate, a gate insulating layer formed on the gate and the first base substrate, a semiconductor layer formed on the gate insulating layer, a light-shielding layer located on the semiconductor layer, a source and a drain formed on the light-shielding layer, the semiconductor layer and the gate insulating layer, an insulating protective layer formed on the source, the drain, the light-shielding later and the gate insulating layer, and a pixel electrode formed on the insulating protective layer; and the light-shielding layer serving as an etching stopper and shielding light, having a size smaller than the semiconductor layer and made of a light-absorbing positive photo-resist.

7. The LCD panel as claimed in claim 6, wherein the thickness of the light-shielding layer is 0.7-1.7 μm.

8. The LCD panel as claimed in claim 6, wherein the semiconductor layer comprises a channel region located in the middle and an ohmic contact region located at both ends, the light-shielding layer completely covers the channel region, the ohmic contact regions are obtained by performing phosphorus ion-implanted with the light-shielding layer as a shielding layer on both ends of the semiconductor layer, the source and the drain contact respectively with the ohmic contact region at the two ends of the semiconductor layer.

9. The LCD panel as claimed in claim 6, wherein the insulating protective layer is disposed with a via hole penetrating the insulating protective layer above the drain, and the pixel electrode contacts the drain through the via hole.

10. The LCD panel as claimed in claim 6, wherein he semiconductor layer is obtained by using the photo-resist layer disposed on the amorphous silicon (a-Si) layer as a shielding layer to perform etching on the a-Si layer, the light-shielding layer is obtained by baking the photo-resist layer.

11. A liquid crystal display (LCD) panel, which comprises: an array substrate, a color filer (CF) substrate disposed opposite to the array substrate, and a liquid crystal (LC) layer sandwiched between the array substrate and the CF substrate;

the array substrate comprising: a first base substrate, a plurality of gate scan lines and a plurality of data lines disposed on the first base substrate, and a plurality of pixel units defined by the mutually insulated plurality of gate scan lines and data lines, and arranged in an array;

the CF substrate comprising: a second base substrate, a CF layer disposed on a surface of the CF substrate near the array substrate, a common electrode layer disposed on the CF layer, and a spacer layer disposed on the common electrode layer;

each pixel unit of the array substrate comprising: a gate formed on the first base substrate, a gate insulating layer formed on the gate and the first base substrate, a semiconductor layer formed on the gate insulating layer, a light-shielding layer located on the semiconductor layer, a source and a drain formed on the light-shielding layer, the semiconductor layer and the gate insulating layer, an insulating protective layer formed on the source, the drain, the light-shielding later and the gate insulating layer, and a pixel electrode formed on the insulating protective layer; and the light-shielding layer serving as an etching stopper and shielding light, having a size smaller than the semiconductor layer and made of a light-absorbing positive photo-resist;

wherein the thickness of the light-shielding layer is 0.7-1.7 μm; and wherein the semiconductor layer comprises a channel region located in the middle and an ohmic contact region located at both ends, the light-shielding layer completely covers the channel region, the ohmic contact regions are obtained by performing phosphorus ion-implanted with the light-shielding layer as a shielding layer on both ends of the semiconductor layer, the source and the drain contact respectively with the ohmic contact region at the two ends of the semiconductor layer.

12. The LCD panel as claimed in claim 11, wherein the insulating protective layer is disposed with a via hole penetrating the insulating protective layer above the drain, and the pixel electrode contacts the drain through the via hole.

13. The LCD panel as claimed in claim 11, wherein he semiconductor layer is obtained by using the photo-resist layer disposed on the amorphous silicon (a-Si) layer as a shielding layer to perform etching on the a-Si layer, the light-shielding layer is obtained by baking the photo-resist layer.

\* \* \* \* \*